United States Patent
Pyeon

(10) Patent No.: US 7,913,128 B2
(45) Date of Patent: Mar. 22, 2011

(54) DATA CHANNEL TEST APPARATUS AND METHOD THEREOF

(75) Inventor: Hong Beom Pyeon, Kanata (CA)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 391 days.

(21) Appl. No.: 12/028,335

(22) Filed: Feb. 8, 2008

(65) Prior Publication Data

US 2009/0138768 A1 May 28, 2009
US 2009/0265589 A2 Oct. 22, 2009

Related U.S. Application Data

(60) Provisional application No. 60/989,879, filed on Nov. 23, 2007.

(51) Int. Cl.
    *G01R 31/28* (2006.01)
(52) U.S. Cl. .................... 714/715; 714/712
(58) Field of Classification Search .............. None
    See application file for complete search history.

(56) References Cited

U.S. PATENT DOCUMENTS

| | | | |
|---|---|---|---|
| 4,174,536 A | 11/1979 | Misunas et al. | |
| 4,710,931 A | 12/1987 | Bellay et al. | |
| 4,733,376 A | 3/1988 | Ogawa | |
| 4,796,231 A | 1/1989 | Pinkham | |
| 5,126,808 A | 6/1992 | Montalvo et al. | |
| 5,132,635 A | 7/1992 | Kennedy | |
| 5,136,292 A | 8/1992 | Ishida | |
| 5,175,819 A | 12/1992 | Le Ngoc et al. | |
| 5,185,722 A * | 2/1993 | Ota et al. | 365/201 |
| 5,243,703 A | 9/1993 | Farmwald et al. | |
| 5,280,539 A | 1/1994 | Yeom et al. | |
| 5,365,484 A | 11/1994 | Cleveland et al. | |
| 5,404,460 A | 4/1995 | Thomsen et al. | |
| 5,430,735 A * | 7/1995 | Sauerwald et al. | 714/731 |
| 5,440,694 A | 8/1995 | Nakajima | |
| 5,452,259 A | 9/1995 | McLaury | |

(Continued)

FOREIGN PATENT DOCUMENTS

EP  0350538 B1  12/1993

(Continued)

OTHER PUBLICATIONS

International Application No. PCT/CA2008/002051: International Search Report dated Mar. 9, 2009, p. 2.
Samsung Electronics Co. LTD, "256M×8 Bit / 128 M×16 Bit / 512M×8 Bit NAND Flash Memory", K9K4GO8U1M, May 6, 2005, pp. 1-41.
Toshiba, "2GBIT (256M×8 Bits) CMOS NAND E2PROM", TH58NVG1S3AFT05, May 19, 2003, pp. 1-32.

(Continued)

*Primary Examiner* — Robert Beausoliel
*Assistant Examiner* — Guerrier Merant
(74) *Attorney, Agent, or Firm* — Mukundan Chakrapani; Borden Ladner Gervais LLP

(57) ABSTRACT

A system includes a plurality of devices that are connected in series and a controller that communicates with the devices. Each of the devices has a plurality of input ports and corresponding output ports. The outputs of one device and the inputs of a next device are interconnected. The controller is coupled to the first device and the last device of the series-connection. The controller applies a test pattern to the plurality of input ports at the first device connected in series, by the controller. Each data channel defines a data path between corresponding pairs of input and output ports of the first and last devices. A data channel is enabled if the test pattern is detected at its corresponding output port.

26 Claims, 12 Drawing Sheets

U.S. PATENT DOCUMENTS

| | | | |
|---|---|---|---|
| 5,473,563 | A | 12/1995 | Suh et al. |
| 5,473,566 | A | 12/1995 | Rao |
| 5,473,577 | A | 12/1995 | Miyake et al. |
| 5,526,311 | A | 6/1996 | Kreifels et al. |
| 5,579,272 | A | 11/1996 | Uchida |
| 5,596,724 | A | 1/1997 | Mullins et al. |
| 5,602,780 | A | 2/1997 | Diem et al. |
| 5,636,342 | A | 6/1997 | Jeffries |
| 5,671,178 | A | 9/1997 | Park et al. |
| 5,691,949 | A * | 11/1997 | Hively et al. ............ 365/230.03 |
| 5,721,840 | A | 2/1998 | Soga |
| 5,740,379 | A | 4/1998 | Hartwig |
| 5,761,146 | A | 6/1998 | Yoo et al. |
| 5,771,199 | A | 6/1998 | Lee |
| 5,777,488 | A | 7/1998 | Dryer et al. |
| 5,802,006 | A | 9/1998 | Ohta |
| 5,818,785 | A | 10/1998 | Ohshima |
| 5,828,899 | A | 10/1998 | Richard et al. |
| 5,835,935 | A | 11/1998 | Estakhri et al. |
| 5,859,809 | A | 1/1999 | Kim |
| 5,872,994 | A | 2/1999 | Akiyama et al. |
| 5,896,400 | A | 4/1999 | Roohparvar et al. |
| 5,900,021 | A | 5/1999 | Tiede et al. |
| 5,913,928 | A | 6/1999 | Morzano |
| 5,926,422 | A | 7/1999 | Haukness |
| 5,937,425 | A | 8/1999 | Ban |
| 5,941,974 | A | 8/1999 | Babin |
| 5,959,930 | A | 9/1999 | Sakurai |
| 5,995,417 | A | 11/1999 | Chen et al. |
| 6,002,638 | A | 12/1999 | John |
| 6,049,901 | A | 4/2000 | Stock et al. |
| 6,085,290 | A | 7/2000 | Smith et al. |
| 6,091,660 | A | 7/2000 | Sasaki et al. |
| 6,107,658 | A | 8/2000 | Itoh et al. |
| 6,144,576 | A | 11/2000 | Leddige et al. |
| 6,148,364 | A | 11/2000 | Srinivasan et al. |
| 6,178,135 | B1 | 1/2001 | Kang |
| 6,185,708 | B1 * | 2/2001 | Sugamori ................ 714/724 |
| 6,295,618 | B1 | 9/2001 | Keeth |
| 6,304,921 | B1 | 10/2001 | Rooke |
| 6,317,350 | B1 | 11/2001 | Pereira et al. |
| 6,317,352 | B1 | 11/2001 | Halbert et al. |
| 6,438,064 | B2 | 8/2002 | Ooishi |
| 6,442,098 | B1 | 8/2002 | Kengeri |
| 6,535,948 | B1 | 3/2003 | Wheeler et al. |
| 6,584,303 | B1 | 6/2003 | Kingswood et al. |
| 6,594,183 | B1 | 7/2003 | Lofgren et al. |
| 6,601,199 | B1 | 7/2003 | Fukuda et al. |
| 6,611,466 | B2 | 8/2003 | Lee et al. |
| 6,658,582 | B1 | 12/2003 | Han |
| 6,680,904 | B1 | 1/2004 | Kaplan et al. |
| 6,715,044 | B2 | 3/2004 | Lofgren et al. |
| 6,732,221 | B2 | 5/2004 | Ban |
| 6,754,807 | B1 | 6/2004 | Parthasarathy et al. |
| 6,763,426 | B1 | 7/2004 | James et al. |
| 6,799,133 | B2 | 9/2004 | McIntosh et al. |
| 6,807,103 | B2 | 10/2004 | Cavaleri et al. |
| 6,816,933 | B1 | 11/2004 | Andreas |
| 6,850,443 | B2 | 2/2005 | Lofgren et al. |
| 6,853,557 | B1 | 2/2005 | Haba et al. |
| 6,853,573 | B2 | 2/2005 | Kim et al. |
| 6,928,501 | B2 | 8/2005 | Andreas et al. |
| 6,930,936 | B2 | 8/2005 | Santin |
| 6,938,188 | B1 | 8/2005 | Kelleher |
| 6,944,697 | B2 | 9/2005 | Andreas |
| 6,950,325 | B1 | 9/2005 | Chen |
| 6,961,882 | B2 | 11/2005 | Manfred et al. |
| 6,967,874 | B2 | 11/2005 | Hosono |
| 6,978,402 | B2 | 12/2005 | Hirabayashi |
| 7,024,605 | B2 | 4/2006 | Sera et al. |
| 7,073,022 | B2 | 7/2006 | El-Batal et al. |
| 2002/0188781 | A1 | 12/2002 | Schoch et al. |
| 2004/0001380 | A1 | 1/2004 | Becca et al. |
| 2004/0019736 | A1 | 1/2004 | Kim et al. |
| 2004/0024960 | A1 | 2/2004 | King et al. |
| 2004/0039854 | A1 | 2/2004 | Estakhri et al. |
| 2004/0199721 | A1 | 10/2004 | Chen |
| 2004/0230738 | A1 | 11/2004 | Lim et al. |
| 2005/0015213 | A1 | 1/2005 | Somervill et al. |
| 2005/0105350 | A1 * | 5/2005 | Zimmerman ................ 365/201 |
| 2005/0160218 | A1 | 7/2005 | See et al. |
| 2005/0213421 | A1 | 9/2005 | Polizzi et al. |
| 2006/0050594 | A1 | 3/2006 | Park |
| 2006/0107186 | A1 * | 5/2006 | Cowell et al. ................ 714/776 |
| 2007/0022349 | A1 * | 1/2007 | Bertocelli et al. ............ 714/741 |
| 2009/0006837 | A1 * | 1/2009 | Rothman et al. .............. 713/100 |

FOREIGN PATENT DOCUMENTS

| | | |
|---|---|---|
| EP | 0588507 A3 | 1/1998 |

OTHER PUBLICATIONS

Amtel Corp., "High Speed Small Sectored SPI Flash Memory", pp. 1-22, 2006.

64 Megabit CMOS 3.0 Volt Flash Memory with 50MHz SPI, Spansion, pp. 1-22 (2006).

King, et al., "Communicating with Daisy Chained MCP42XXX Digital Potentiometers", Microchip AN747, pp. 1-8, 2001.

Intel Corporation, "Intel® Advanced+ Boot Block Flash Memory (C3)", May 2005, pp. 1-72.

M-Systems Flash Disk Pioneers LTD., "DiskOnChip H1 4Gb (512MByte) and 8Gb (1 GByte) High Capacity Flash Disk with NAND and x2 Technology", Data Sheet, Rev. 0.5 (Preliminary), pp. 1-66, 2005.

Tal, A., "Guidelines for Integrating DiskOnChip in a Host System", AP-DOC-1004, Rev. 1.0, M-Systems Flash Pioneers Ltd., pp. 1-15, 2004.

Samsung Electronics Co. Ltd, OneNAND4G(KFW4G16Q2M-DEB6), OneNAND2G(KFH2G16Q2M-DEB6), OneNAND1G(KFW1G16Q2M-DEB6) Flash Memory, OneNAND™ Specification Ver. 1.2, pp. 1-125, Dec. 23, 2005.

Kennedy, J., et al., "A 2Gb/s Point-to-Point Heterogeneous Voltage Capable DRAM Interface for Capacity-Scalable Memory Subsystems", ISSCC 2004/Session 1/DRAM/11.8, IEEE International Solid-State Circuits Conference, Feb. 15-19, 2004, vol. 1, pp. 214-523.

Kim, Jae-Kwan, et al., "A 3.6Gb/s/pin Simultaneous Bidirectional (SBD) I/O Interface for High-Speed DRAM", ISSCC 2004/Session 22/DSL and Multi-Gb/s I/O 22.7, IEEE International Solid-State Circuits Conference Feb. 15-19, 2004, vol. 1, pp. 414-415.

"HyperTransport TM I/O Link Specification", Revision 2.00, Document No. HTC20031217-0036-00, Hypertransport Technology Consortium, pp. 1-325, 2001.

"IEEE Standard for High-Bandwidth Memory Interface Based on Scalable Coherent Interface (SCI) Signaling Technology (RamLink)", IEEE Std. 1596.4-1996, The Institute of Electrical Electronics Engineers, Inc., pp. i-91, (Mar. 1996).

Oshima, et al., "High-Speed Memory Architectures for Multimedia Applications", Circuits & Devices, IEEE 8755-3996/97, pp. 8-13, Jan. 1997.

Gjessing, S., et al., "RamLink: A High-Bandwidth Point-to-Point Memory Architecture", Proceedings CompCom 1992, IEEE 0-8186-2655-0/92, pp. 328-331, Feb. 24-28, 1992.

Gjessing, S., et al., "Performance of the RamLink Memory Architecture", Proceedings of the Twenty-Seventh Annual Hawaii International Conference on System Sciences, IEEE 1060-3425/94, pp. 154-162, Jan. 1994.

Gjessing, S., et al., "A RAM Link for High Speed", Special Report/Memory, IEEE Spectrum, pp. 52-53, Oct. 1992.

Diamond, S.L., "SyncLink: High: High-speed DRAM for the Future", Micro Standards, IEEE Micro, pp. 74-75, Dec. 1996.

Samsung Electronics, "DDR2 Fully Buffered DIMM 240pin FBDIMMS based on 512Mb C-die" Rev. 1.3, Sep. 2006, pp. 1-32, Sep. 2006.

"HyperTransport TM I/O Link Specification", Revision 3.00, Document No. HTC20051222-0046-008, Hypertransport Technolology Consortium, pp. 1-428, Apr. 2006.

* cited by examiner

DATA CHANNEL TEST APPARATUS AND METHOD THEREOF

CROSS REFERENCE TO RELATED APPLICATIONS

This application claims the benefit of priority from U.S. Provisional Patent Application No. 60/989,879 filed Nov. 23, 2007, the disclosure of which is expressly incorporated herein by reference in its entirety.

FIELD OF THE INVENTION

The present invention relates generally to the testing of a system having a plurality of devices. More particularly, the present invention relates to the testing of data channels in a system of devices connected in series.

BACKGROUND OF THE INVENTION

Semiconductor memory devices are important components in presently available industrial and consumer electronics products. For example, computers, mobile phones, and other portable electronics all rely on some form of memory for storing data. While many memory devices are typically available as commodity devices, the need for higher integration has led to the development of embedded memory, which can be integrated with systems, such as microcontrollers and other processing circuits.

Unfortunately, the density of commodity memory cannot match the ever-increasing demand for memory. Hence multiple commodity memories are used together to fulfill the system memory requirements. Multi-device memory systems can be implemented as a set of silicon chips grouped together in a single package (called a multi chip system—MCP), or a multiplicity of memory device packages grouped together on a printed circuit board.

More often, the multi-device memory systems employ, non-volatile devices, such as flash devices, for storage. Demand for flash memory devices has continued to grow significantly because these devices are well suited in various embedded applications that require non-volatile storage. For example, flash is widely used in various consumer devices, such as digital cameras, cell phones, USB flash drives and portable music players, to store data used by these devices. Market demand for flash memory has led to tremendous improvements in flash memory technology over the past several years both in terms of speed and density.

Some flash devices employ serial interfaces such as, for example, multiple flash devices, which are used to perform operations, such as read, write and erase operations, on memory contained in the devices. A system of devices connected in series has input ports in the first device and output ports in the last device as shown in FIG. 1. Data is serially transferred from the input ports in the first device to the output ports in the last device. The configuration of the series-connected devices shown in FIG. 1 will be discussed in detail below.

Those skilled in the art understand that multi-device systems are tested at the individual component level and at the system level to ensure robustness of operation. In particular, memory devices are tested at the chip level to ensure that their memory cells are not defective. A defective memory cell is one that does not store data properly, due to fabrication defects or other defects that may occur during fabrication or assembly of the memory device.

Although each device is tested through functional and DC test steps at wafer-level and package level to screen out the device with defects on memory or logic blocks, it is difficult to find which devices have failed once they are mounted on the system board after packaging with stacked devices in a series-connection configuration. In conjunction with this problem, if there were any single failed device in the system of devices connected in series, all devices on the connection would be shown as defective devices due to data transmission failure caused by the failed device.

Typically, a fault in any single pin or in the interconnection between devices in the system of devices connected in series causes all devices to be judged as "failed" and no more testing is possible. Needless to say that the cost of stacked devices is much higher than the cost of a single device, and even good devices without any faults could be thrown away, or a system board with these devices may be replaced with a new one.

SUMMARY OF THE INVENTION

An apparatus and method for testing and enabling data channels path in a system of devices connected in series is disclosed. The devices are, for example, memory devices, such as dynamic random access memories (DRAMs), static random access memories (SRAMs) and flash memories.

According to an aspect of the present invention, there is provided a method for enabling data channels in series-connected devices. The method comprises applying a test pattern to a plurality of input ports at a first device of the series-connected devices. The plurality of input ports has a corresponding plurality of output ports at a last device of the series-connected devices. Each data channel defines a data path between corresponding pairs of input and output ports. The method also comprises enabling a data channel if the test pattern is detected at its corresponding output port.

According to another aspect of the present invention, there is provided a device for use in a system of a plurality of devices connected in series and a controller. The device comprises a plurality of input connections and corresponding plurality of output connections; a plurality of use-state registers associated with each of the corresponding input and output connections to indicate a use-state of the corresponding input and output connections; and a data mode configuration register to indicate the maximum data width for transmission through the device.

According to another aspect of the present invention, there is provided a controller for enabling data channels in a plurality of devices connected in series. The controller comprises a test pattern generator for providing a test pattern to a plurality of input ports at a first device of the plurality of devices connected in series. The plurality of input ports has a corresponding plurality of output ports at a last device of the plurality of devices connected in series. Each data channel defines a data path between corresponding pairs of input and output ports of the plurality of devices connected in series in a data channel test operation. The controller enables data channels if the test pattern is detected at its corresponding output port.

According to another aspect of the present invention, there is provided a system comprising a plurality of devices, having a plurality of data channels, connected in series. The plurality of devices has a plurality of input ports at a first device of the plurality of devices connected in series. The plurality of input ports has a corresponding plurality of output ports at a last device of the plurality of devices connected in series. Each data channel defines a data path between corresponding pairs of input and output ports. The system also comprises a controller coupled to the plurality of input ports and the corresponding plurality of output ports. The controller has a test pattern generator for providing a test pattern to the plurality of input ports in a data channel test operation. The controller enables data channels if the test pattern is detected at its corresponding output port.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides a system of devices connected in series. An apparatus and a method for testing of data channels in a system of devices connected in series are disclosed.

The method and apparatus in accordance with the techniques described herein may be applicable to a memory system having a plurality of devices connected in series. The devices are, for example, memory devices, such as dynamic random access memories (DRAMs), static random access memories (SRAMs) and flash memories.

Figure 1:
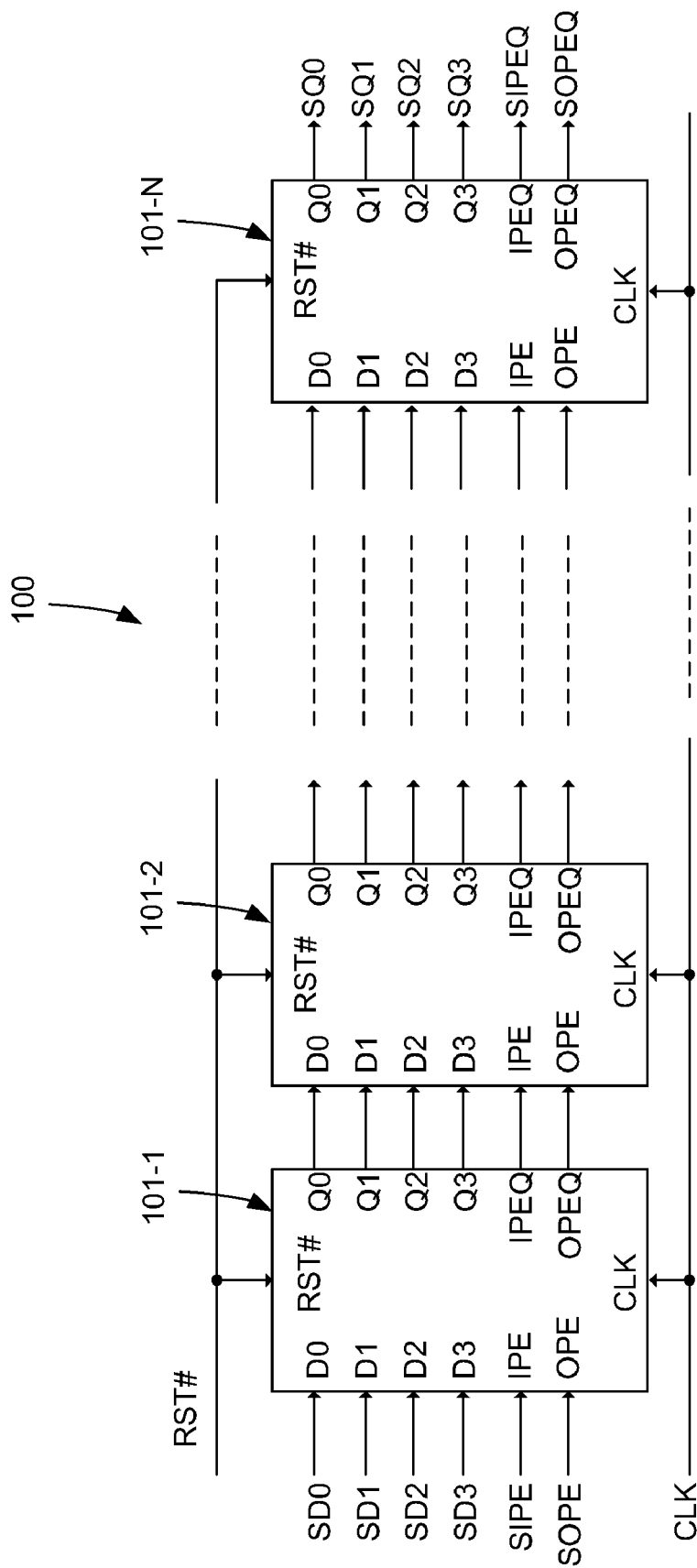
FIG. 1 is an illustration of a plurality of devices connected in series.

FIG. 1 shows an exemplary series-connection configuration including a plurality of devices 101-1-101-N having four data input connections, such as data input pins D0-D3 and four data output connections, such as data output pins Q0-Q3 connected in series. The configuration 100 of a plurality of devices connected in series has four data input ports to receive input serial data SD0-SD3 at a first device 101-1 of the system and four data output ports to output serial data SQ0-SQ3 at a last device 101-N of the system. Each of the devices have additional pins such as input port enable IPE, output port enable OPE, clock, reset, chip select (not shown) etc. for various signals. Each of the series-connected devices 101-1-101-N has the same structure. A controller (not shown) provides a group of signals including chip select CS# (not shown), serial input port enable (SIPE), serial output port enable (SOPE), clock CLK, reset RST# and other control and data information (not shown) to the devices. The configuration 100 shown in FIG. 1 can be, for example, a plurality of memory devices connected in series and a memory controller. The memory controller communicates with the devices to control operations of the series-connected memory devices.

The devices shown in FIG. 1 each have four data input pins D0-D3 and four data output pins Q0-Q3. As such, the devices shown in FIG. 1 are configured to operate in multi-data width modes viz., X1, X2 or X4 modes. Briefly, one or more pins for connection are used to transfer data serially through the devices according to the chosen data width mode. For example, a byte of data is transferred in eight clock cycles in the X1 mode using a single set of pins (default D0 and Q0); four clock cycles in the X2 mode using a two sets of pins (default D0, D1 and Q0, Q1), and two clock cycles in the X4 mode using all pins (D0-D3 and Q0-Q3). The multi-data width modes will be discussed in detail below with reference to FIGS. 9A and 9B.

The configuration 100 of the devices 101-1-101-N in FIG. 1 includes both series-connections (e.g., serial input and output) and conventional multi-drop connections (e.g., CLK and RST#). Thus, the configuration may be referred to as a hybrid connection configuration, where the advantages of each of the series-connection and multi-drop connection may be realized.

Figure 2A:
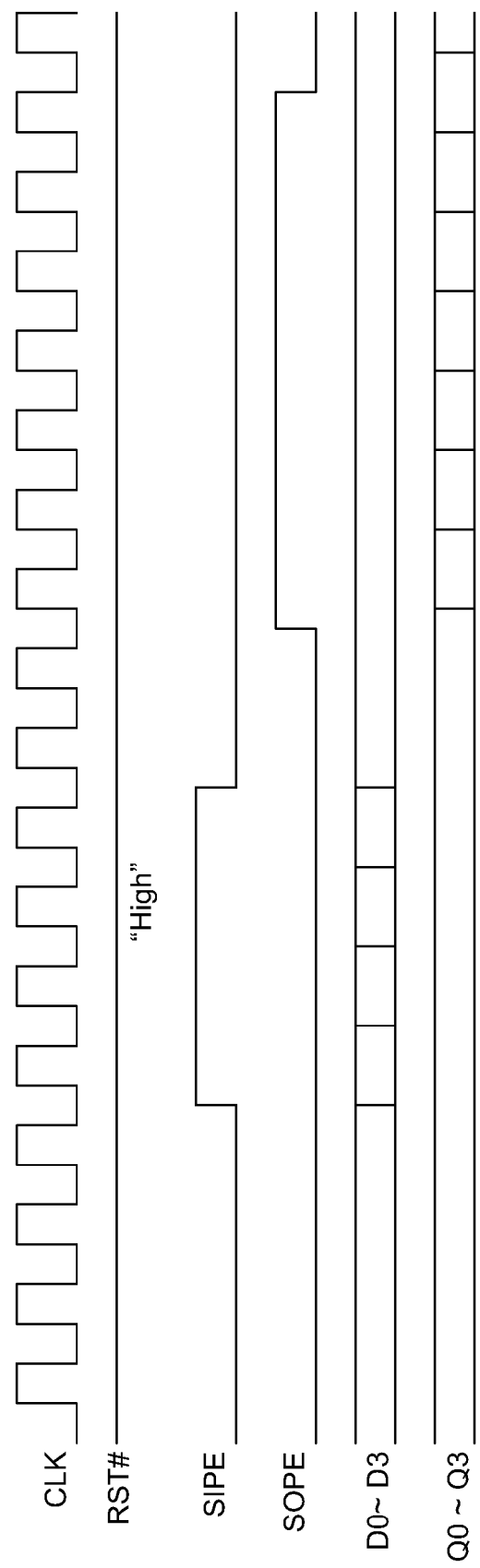
FIG. 2A is an illustration of a timing configuration during normal operation of a device of FIG. 1.

FIG. 2A illustrates timing configurations during normal operation of a device in the configuration 100 of FIG. 1, showing signals transferred between the devices. A chip select signal CS# (not shown) is first asserted to select the devices. In the exemplary operation shown in FIG. 2A, the reset signal RST# is held high for maintaining all devices in a normal state. Information is transmitted to the first device 101-1 in the plurality of devices connected in series by asserting SIPE and clocking data through data input pins D0-D3 of device 101-1 on successive rising edges of the clock signal CLK. An input port enable signal SIPE is propagated through the first device 101-1 to the second device 101-2 from the IPEQ pin of the first device 101-1 to the IPE input of the second device 101-2. This process is repeated for successive devices in the system of devices connected series. Typically, control signals are synchronized with the rising (or falling) edge of the signal CLK in order to ensure a proper setup time for these signals at the next device in the system of devices connected in series.

Typically, in a system of memory devices connected in series, routine memory operations are executed on a device using command strings that are serially fed to the devices. The command strings typically contain a command that represents the operation to be selected, as well as other parameters. The operation to be performed may be indicated in an operation (OP) code that is provided to the devices. For example, a write operation can be executed by serially feeding an information string that contains a write command, the data to be written and an address in the memory to the device where the data is to be written.

Figure 2B:
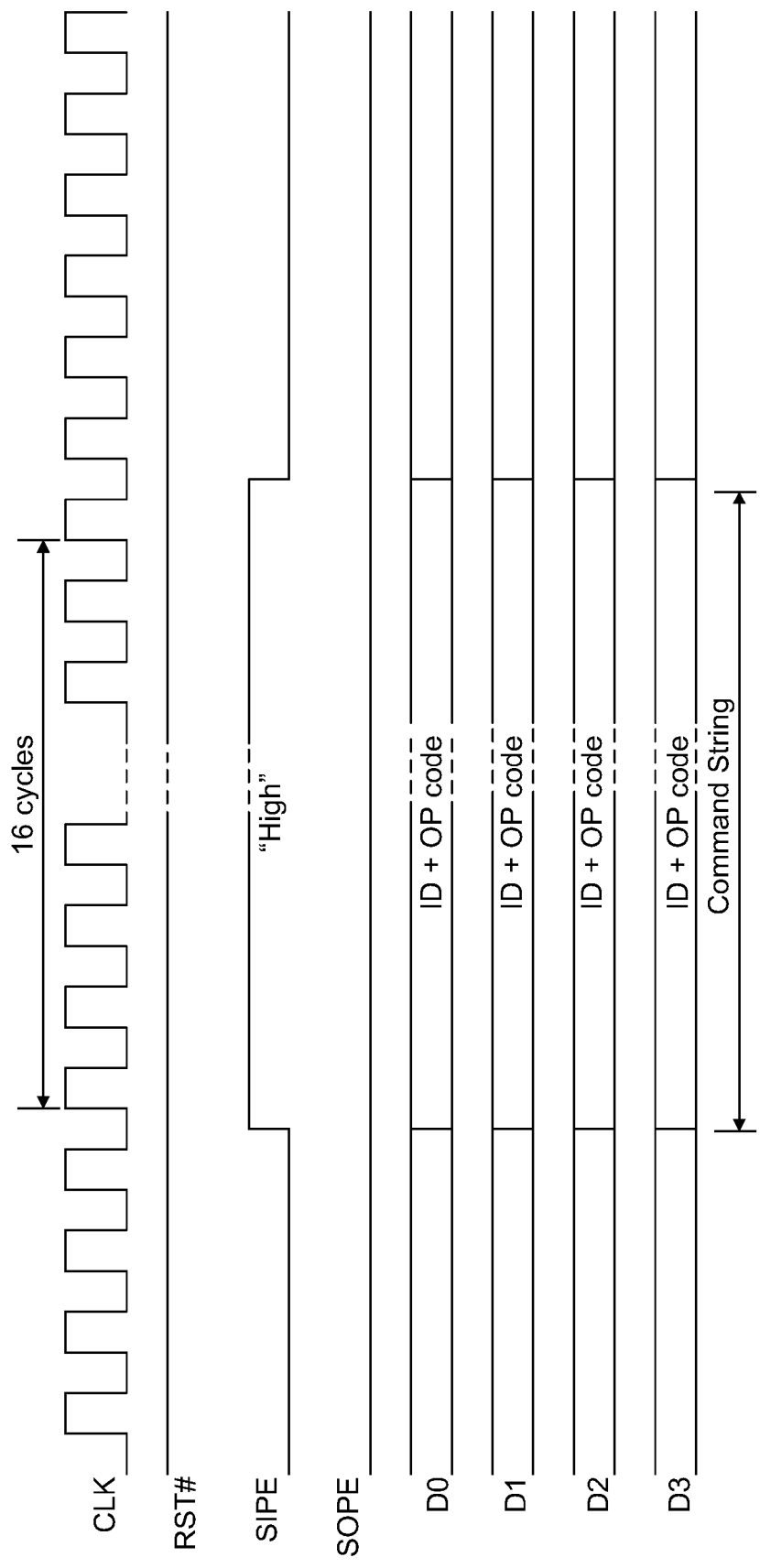
FIG. 2B is an illustration of a timing configuration during a normal command operation of a device of FIG. 1.

For example, the command string is fed to all of the devices even though the command is executed on only one of the devices. For a particular example, to select the device on which the command is to be performed, the command string contains a device identifier (ID) that identifies the device to which the command is directed. Each device receiving the command string compares the device ID contained in the command string to an ID associated with the device. If the two match, the device assumes that the command is directed to the device and performs the command. Thus, input data are transmitted to the selected device without execution of the OP code in the unselected devices. FIG. 2B illustrates timing configurations during normal command operation of a device of FIG. 1 showing signals transferred between the devices. For example, the unselected devices take input data, which is a command string containing device ID and OP code, through the input pins D0-D3 and send it to the next or forward device in the system of devices connected in series, if SIPE signal is in a 'high' state.

As discussed earlier, the plurality of devices connected in series has input ports in the first device and output ports in the last device. A data channel can be defined as a data path between corresponding pairs of input and output ports. In order for the plurality of devices connected in series to properly function, data must be propagated through the data channels from the first device to the last device in the system. Faults within a device or in the interconnection between devices connected in series will result in data not being transferred along a data path and hence result in the loss of use of a data channel.

Figure 3:
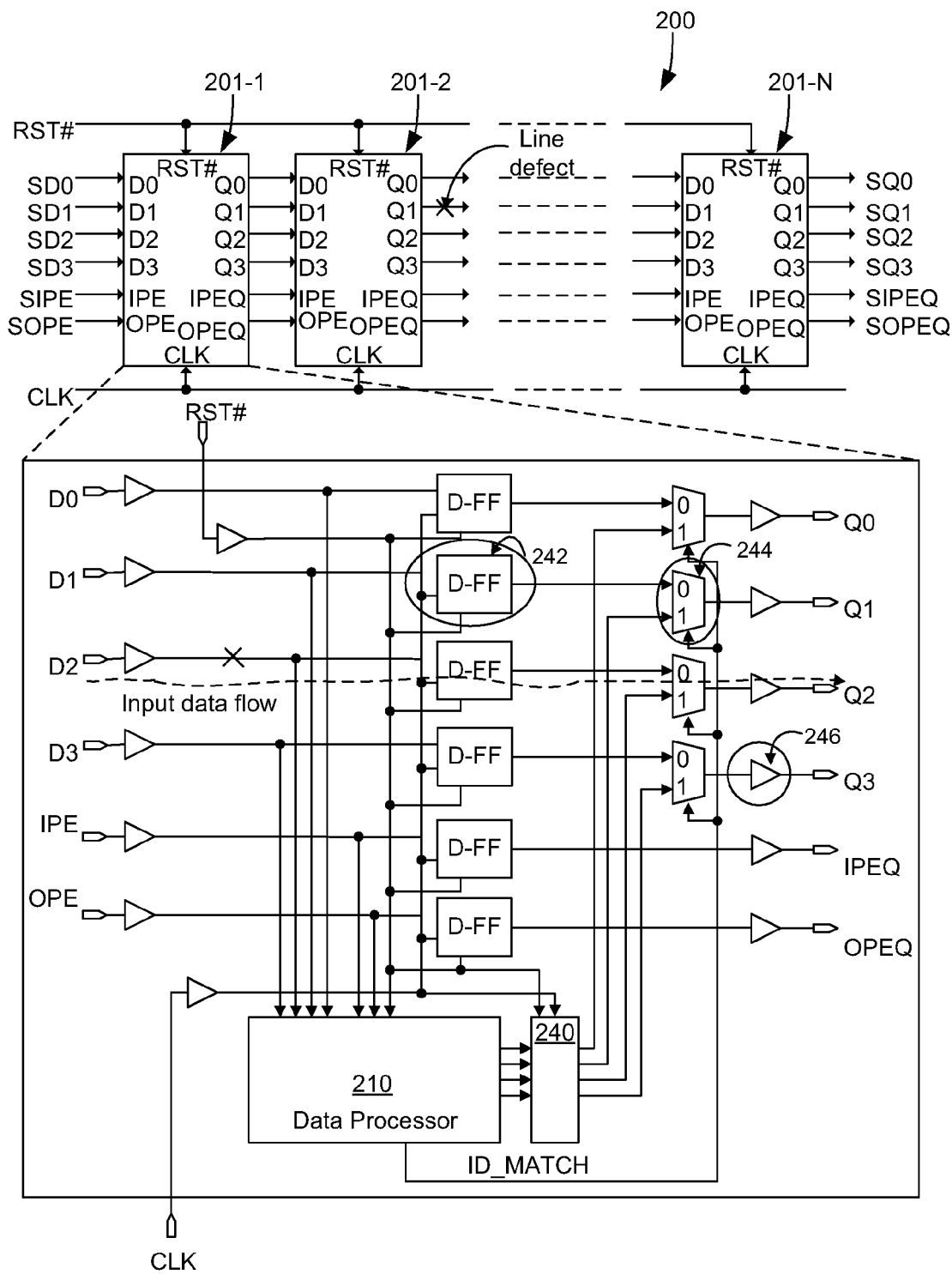
FIG. 3 is an illustration of possible fault locations on a device and in the interconnection between devices in a plurality of devices connected in series.

FIG. 3 is an illustration of possible fault locations on a device and in the interconnection between devices in a configuration 200 of devices connected in series. Similar to FIG. 1 devices 201-1-201-N are connected in series as shown. The input/output pins and the control pins in the system 200 are similar to the configuration 100 of FIG. 1. However, as shown in FIG. 3, there is a line defect (interconnection defect) in the connection of output pin Q1 of device 201-2 and the corresponding input pin of the next device (not shown). In addition, there are internal faults in the first device 201-1 of the system 200. A person of skill in the art will appreciate that defects other than those shown in FIG. 3 are possible.

The device 201-1 is shown in further detail at the bottom of FIG. 3. Typically, data from the input pins D0-D3 flows to the output pins Q0-Q3 through the internal circuitry as shown, for example, by dashed line between input pin D2 and corresponding output pin Q2 in FIG. 3. The internal circuitry comprises for example, buffers, D-flip flops (single bit data registers), selectors etc., and is controlled by a data processor 210 and a shift register 240. In the exemplary device 201-1, there are multiple defects, such as in the D-flip flop 242 and selector 244, in the internal data path between the input pin D1 and the corresponding output pin Q1, as shown by the shaded regions in FIG. 3. Similarly, the buffer 246 prior to the output pin Q3 is defective. These defects result in loss of data transmission in data channels through D1-Q1 and D3-Q3 in the configuration 200.

In conventional wafer-level and package level testing, faults within a device or in the interconnection between devices connected in series, such as those illustrated in FIG. 3, will result in all devices on the connection to be shown as defective devices and the entire system to be discarded. However, as shown in FIG. 3, data transmission can occur in data channels through D0-Q0 and D2-Q2, and the configuration 200 can be operated in X1 and X2 modes. The internal defects and the line defects can be identified using embodiments of the invention disclosed herein and data channels without any defects can be enabled for use by the plurality of devices connected in series.

Figure 4:
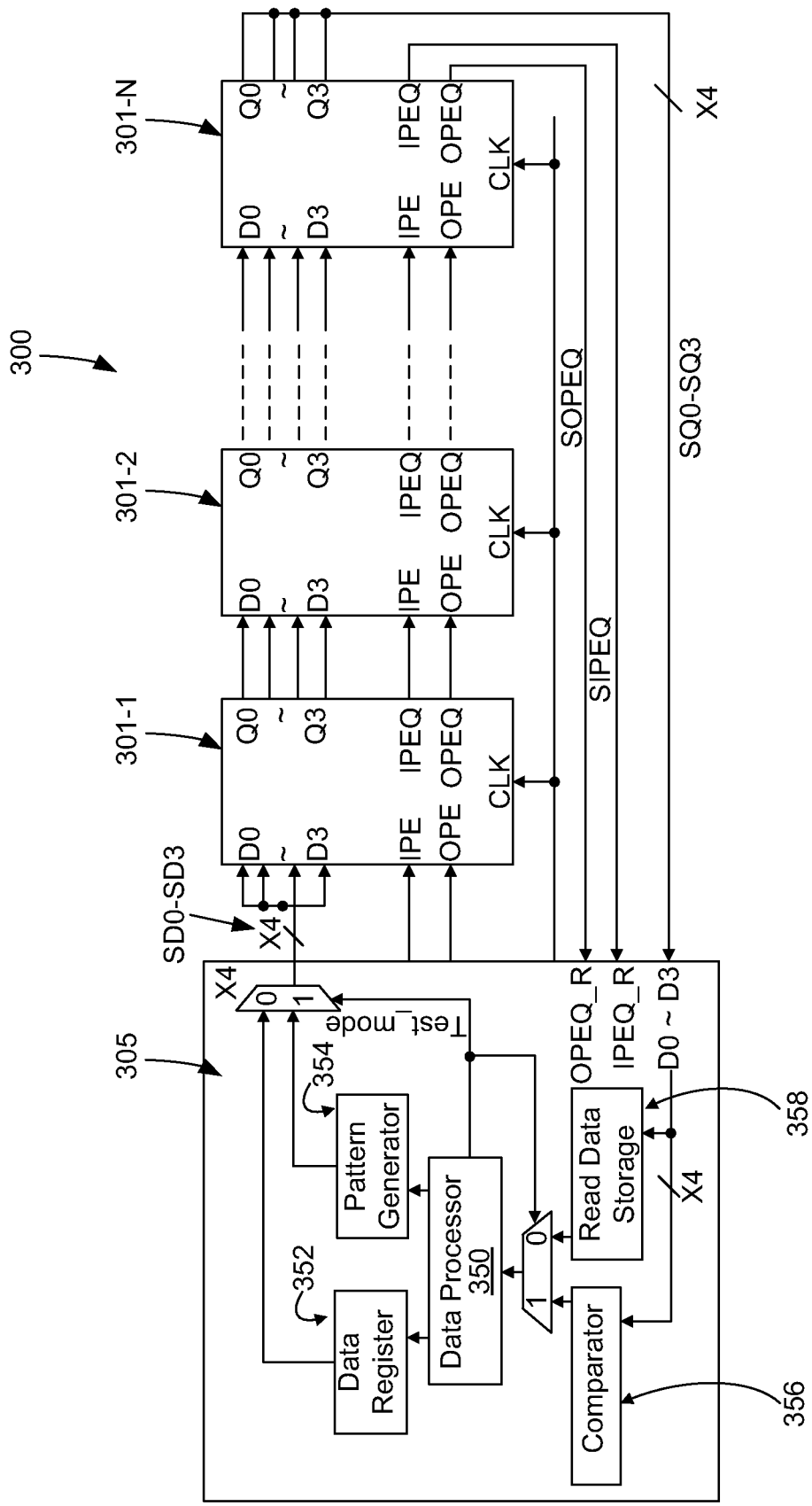
FIG. 4 is an illustration of an apparatus for testing of a data channel in a system of devices connected in series in accordance with an embodiment of the present invention.

FIG. 4 is an illustration of an apparatus for testing of a data channel in a system of devices connected in series in accordance with an embodiment of the present invention. In the system 300, devices 301-1-301-N are connected in series. The system 300 is similar to those described with reference to FIGS. 1 and 3.

The devices 301-1-301-N have four data input pins D0-D3 and four data output pins Q0-Q3 connected in series. The system 300 of devices connected in series has four data input ports to receive input serial data SD0-SD3 at the first device 301-1 of the system and four data output ports to output serial data SQ0-SQ3 at the last device 301-N of the system. Each of the devices have additional pins such as input port enable IPE, output port enable OPE, clock, reset, chip select (not shown) etc. for various signals. Each of the series-connected devices 301-1-301-N has the same structure. Each of the devices in the system 300 has a data processor 310, which will be described below with reference to FIG. 6. As described earlier, the system of FIG. 4 is capable of being operated in multi-data width modes (X1/X2/X4 modes).

A controller 305 provides a group of signals including serial input port enable (SIPE), serial output port enable (SOPE), clock CLK and other control and data information (not shown) to the devices. The controller 305, is for example, a memory controller. The controller 305 also includes a data processor 350, a data register 352, a pattern generator 354, a comparator 356, a read data storage 358 and pins to receive the input port enable signal SIPEQ, the output port enable signal SOPEQ, and the output serial data SQ0-SQ3 from the last of the devices (device 301-N) connected in series. Individual elements of the controller 305 will be described in detail below.

Figure 5:
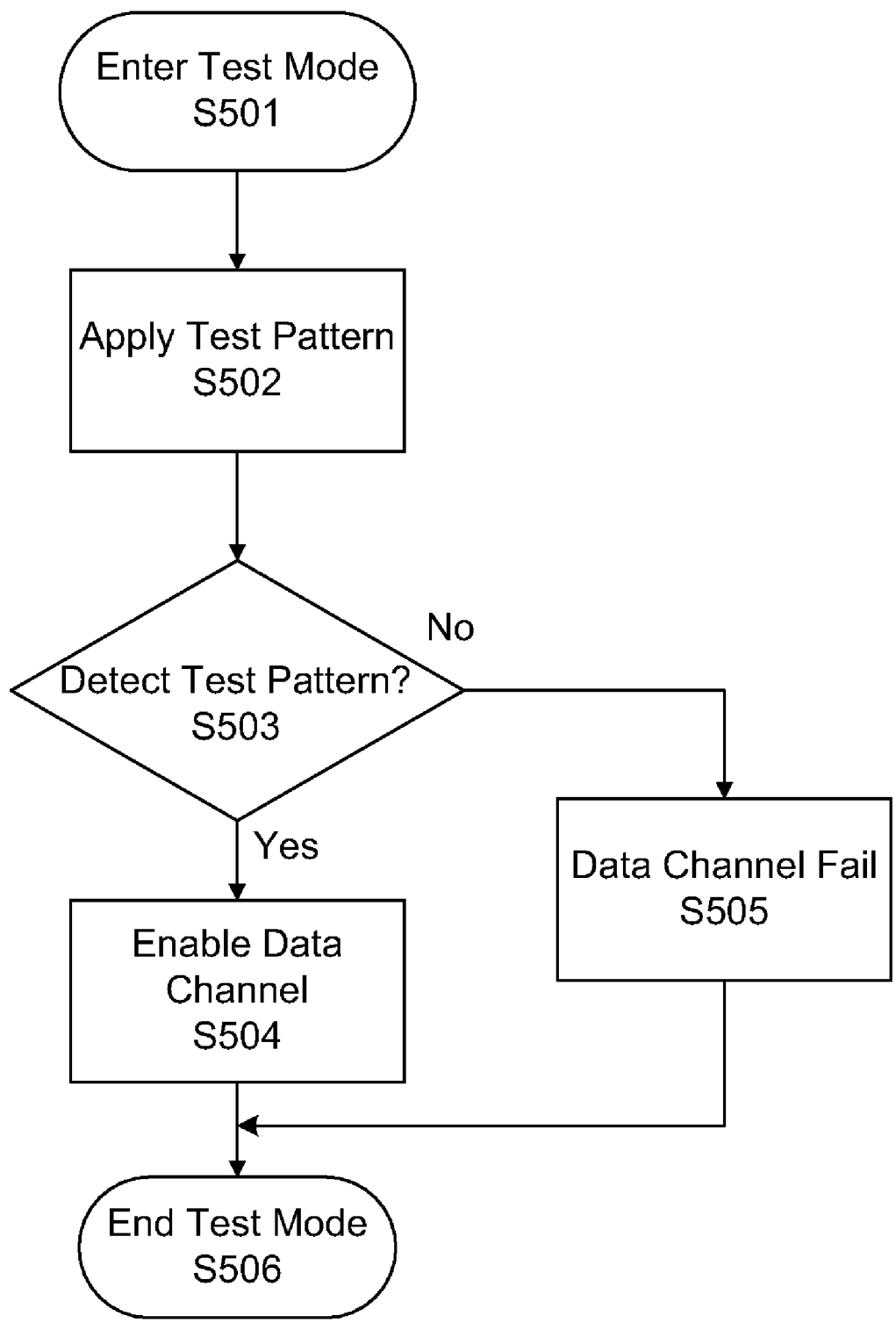
FIG. 5 is an illustration of a method for testing of a data channel in a system of devices connected in accordance with an embodiment of the present invention.

FIG. 5 is an illustration of a method for testing of a data channel in a system of devices connected in accordance with an embodiment of the present invention. Generally, upon entering a test mode (S501), the controller 305 applies a test pattern as an input serial data SD0-SD3 to data input pins D0-D3, which act as a plurality of input ports, at the first device 301-1 of the system 300 of devices connected in series (S502). The plurality of input ports at the first device 301-1 has a corresponding plurality of output ports, corresponding to data output pins Q0-Q3, at the last device 301-N of the system 300. The data channel, between corresponding pairs of input and output ports, is enabled (S504) if the test pattern is detected (S503) at its corresponding output port. The data channel is determined to have failed (S505) if the test pattern is not detected at it corresponding output port. Once all data channels have been enabled (or disabled), the test mode is exited (S506).

Figure 6:
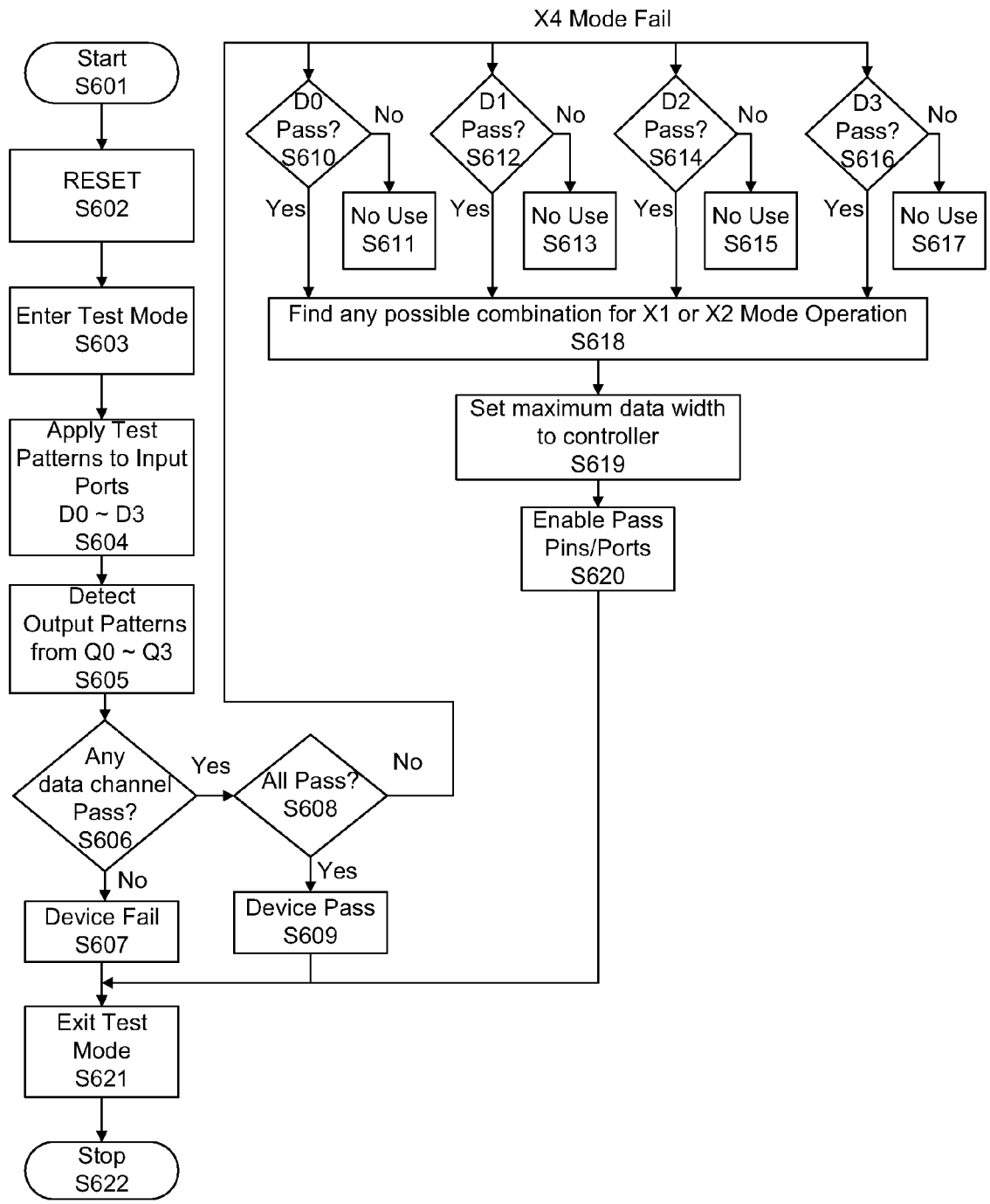
FIG. 6 is an example of a method for testing of input/output buffer path in series-connected devices having a four data pins (input and output pins) and capable of operating in multi-data width modes (X1/X2/X4 modes) in accordance with an embodiment of the present invention.

FIG. 6 is an example of a method for testing of input/output buffer path in the series-connected devices having a four data pins (input and output pins) and capable of operating in multi-data width modes (X1/X2/X4 modes) in accordance with an embodiment of the present invention. For the purposes of this discussion, the maximum data width mode is X4 (4-bit inputs). However, it will be readily apparent to those skilled in the art that high data width modes (for example, 8-bit or 16-bit) are possible according to the system requirements.

As described earlier, a command string propagated in the system of devices connected in series contains a device ID that identifies the device to which the command is directed.

Typically, ID assignments are done prior to any normal operations in the system of devices connected in series. In an exemplary embodiment of the present invention, during test mode (S601), the assigned IDs are initialized or reset in each device prior to enabling the data channels in the system. For example, the assigned IDs can be reset to '00' for all devices, by using a commonly connected hard reset pin (RST#, low enable) (S602). This enables the selection of all devices at once. The hard reset can also initialize use-state registers in each of the device of the system of series-connected devices to a default disabled state.

The test mode is entered by simultaneously asserting input port enable SIPE and output port enable SOPE control signals (S603). When SIPE and SOPE are simultaneously asserted all input and output ports are accessible at the same time. All input ports receive input command from the controller as if each port is simultaneously operating in a X1 mode irrespective of previous data width setting. Typically, in normal operation mode, SIPE and SOPE are not asserted simultaneously.

In a system of devices connected in series, data flow is typically truncated at the device where a device ID match is found. Subsequent (or forward) devices in the system do not receive the input stream except for ID bits. However, by initializing the device IDs of the all the devices in the system to a common known value (for example, '00') and by propagating a 'non-00' ID (no match), the system can be forced into a situation where none of the devices in the system is selected. Thus, the input stream traverses all the devices in the system of devices connected in series.

A test pattern with a 'non-00' ID, is applied to the input pins D0-D3 of the first device 301-1 of the system (S604). As described above, the test pattern flows through system of devices connected in series since no particular device is selected. Test patterns, such as checkerboard, scan zero, scan one etc. can be applied to the system. Once the test pattern has propagated through the system, the output patterns at the output pins Q0-Q3 of the last device 301-N of the system are detected (S605). If the test pattern is not detected in any of the data channels (S606), then the system is determined to have "failed" (S607). However, if the test pattern is detected in all the data channels (S608), the system is determined to have "passed" (S609). In the event that the test pattern is detected in some but not all the data channels, it is determined that the system cannot operate in the X4 mode. However, the system may still be able to operate in X1 or X2 mode and further determination of which of the data channels corresponding to D0-D3 pins are defective is made (S610, S612, S614, S616). The pins corresponding to "failed" data channels are determined to be of no use (S611, S613, S615, S617). Based on the number of "passed" data channels, the possible combinations of pins for X1 or X2 data width mode are determined (S618). A data mode configuration register in each of the devices and the controller is accordingly updated (S619).

All pins corresponding to "passed" data channels are enabled by setting the corresponding use-state registers (S620), in each of the devices in the system, to an enabled mode. Upon setting of use-state registers (S620), determination of the system being passed (S609) or determination of the system being failed (S607), the test mode exits (S621) and the testing is stopped (S622). It should be noted that although the system of devices connected in series can be operated at multi-data widths, the physical pin connection on the system board determines the maximum data width. For example, although the devices 301-1 -301-N can be operated in the X4 mode, if there are only 2 physical pin connections in the system board, the devices can only be operated in the X2 mode.

In the above-described embodiment, the pattern generator 354 of the controller 305, can be used to generate and provide the test pattern to the input pins. The controller 305 outputs the test pattern based on a test_mode signal provided by the data processor 350. In addition, the comparator 356 of the controller 305 can compare the output patterns and determine whether a data channel is defective or not. In normal mode operation, the controller 305 outputs the contents of the data register 352. During normal mode operation, the output serial data or output data stream SQ0-SQ3 is typically stored in the read data storage 358. A controller with a pattern generator and comparator does not demand large area and its area penalty within conventional controller is negligible.

According to Table 1, data channel test results are categorized as two parts when X4 is a maximum physical data width limited by interconnection lines. As described earlier, when the test pattern is not detected in one or more data channels, the system can be operated in X2 and X1 modes only. In order for the system to be operated in X2 mode, two data channels are required. Therefore, in the event that only one data channel fails in a system having four data channels, there is a redundant data channel that is not used. For example, as shown in the last four rows of Table 1, only two of the three "passed" pins are used in the X2 mode.

TABLE 1

| Passed Input/output mode assignment | | | | |
| --- | --- | --- | --- | --- |
| D3/Q3 | D2/Q2 | D1/Q1 | D0/Q0 | Data width setting |
| X | X | X | O | X1 mode |
| X | X | O | X | |
| X | O | X | X | |
| O | X | X | X | |
| X | X | O | O | X2 mode |
| X | O | X | O | ($O_1$ = two input pins |
| O | X | X | O | used in X2 mode) |
| X | O | O | X | |
| O | X | O | X | |
| O | O | X | X | |
| X | O | $O_1$ | $O_1$ | |
| O | $O_1$ | X | $O_1$ | |
| O | X | $O_1$ | $O_1$ | |
| O | $O_1$ | $O_1$ | X | |

Figure 7A:
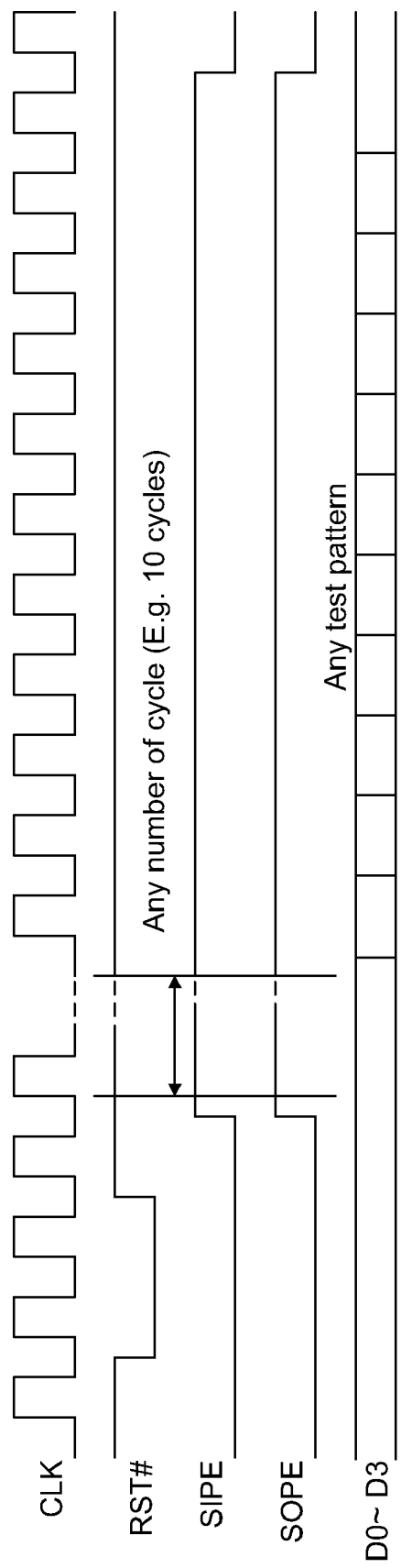
FIG. 7A is an illustration of a timing diagram to activate test mode with IPE and OPE in accordance with an embodiment of the present invention.

FIG. 7A is an illustration of a timing diagram to activate test mode in accordance with an embodiment of the present invention. As described with reference to FIG. 6, prior to entering the test mode, the device IDs of all the devices in the system of device connected in series are initialized using the reset RST# signal. The test mode can be activated by simultaneously asserting SIPE and SOPE. The test pattern is applied to the input pins D0-D3 while continuing to assert SIPE and SOPE as shown in FIG. 7A. In order to avoid timing conflicts with normal mode operation, the SIPE and SOPE are asserted for predetermined number of clock cycles (for example, 10 cycles) prior to applying the test patterns to the input pins.

Figure 7B:
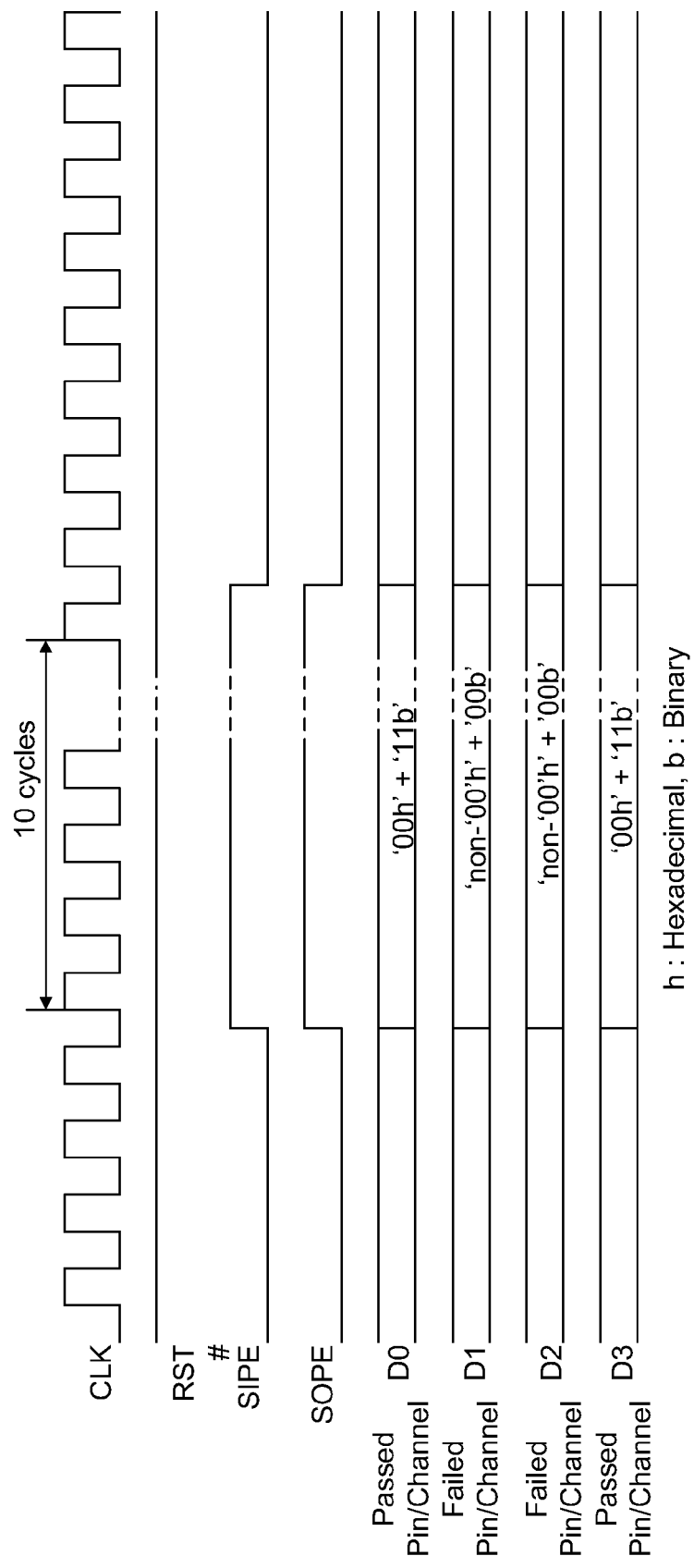
FIG. 7B is an illustration of a timing configuration during a passed I/O command assertion operation in accordance with an embodiment of the present invention.

As a result of test mode operation, the controller 305 knows the pins corresponding to "passed" data channels. The use-state registers corresponding to these pins will now have to be enabled from the default value assigned to the registers prior to the start of the test mode operation. The controller 305 issues a command (for example, Passed I/O set command) that sets a use state of the pins corresponding to the "passed" data channels in all the devices in the system of devices connected in series. Due to the reset operation prior to entering the test mode operation, all devices have the same '00' IDs, as described earlier. Therefore, the Passed I/O set command to set a use state of the pins corresponding to the "passed" data channels has a '00' ID number in the command string. FIG. 7B is an illustration of a timing configuration during a passed I/O command assertion operation in accordance with an embodiment of the present invention.

As described earlier, SIPE and SOPE are simultaneously asserted, all the devices in the system of devices connected in series function in X1 mode, ignoring the setting of a device configuration register (to be discussed with reference to FIG. 8) that contains device I/O configurations such as data mode configuration. Only pins corresponding to "passed" data channel can receive and accept 'Pass I/O set command' and the use-state registers associated with those pins are enabled until power-down. Power-down and power-up can reset the setting of the use-state or the Pass I/O set command bit in the use state register of the devices. The pins corresponding to "failed" data channels cannot propagate any input streams to the next device so that initially set default disabled state of the use-state registers are maintained.

Both the test mode operation and the enabling of pins and setting of the corresponding use state registers are activated by simultaneously asserting SIPE and SOPE (see FIGS. 7A and 7B). In order to distinguish the two operations, ID number and dummy cycles are used. In the use-state enabling operation following the test mode, a '00' ID number is used along with a 2-bit code '11' for setting the use-state of the pins corresponding to "passed" data channels (for example, D0 and D3 in FIG. 7B). On the other hand, a non-zero ID and 2-bit code '00' is used for setting the use-state of the pins corresponding to "failed" data channels (for example, D1 and D2 in FIG. 7B).

Figure 8:
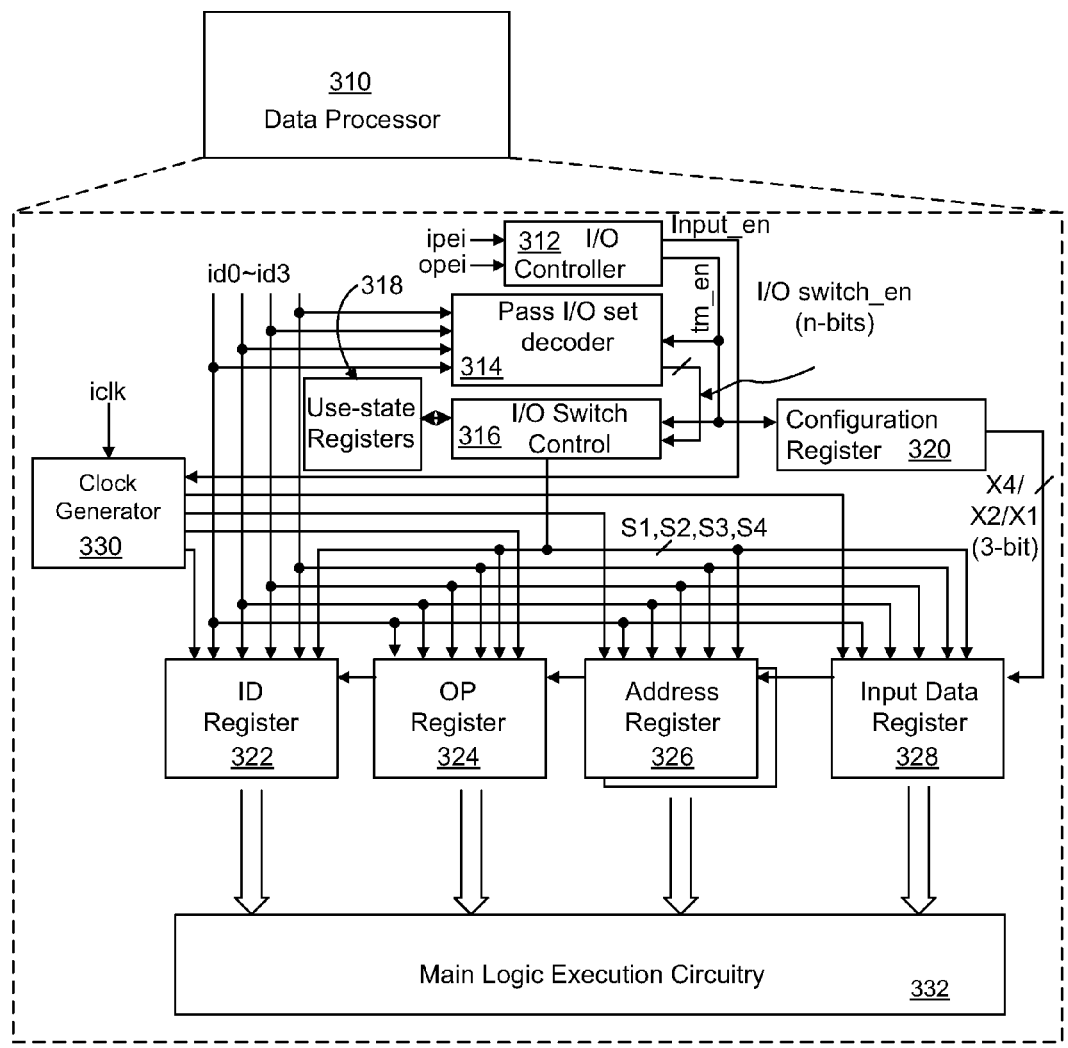
FIG. 8 is a schematic representation of the data processor of a device shown in FIG. 4 in accordance with an embodiment of the present invention.

FIG. 8 is a schematic representation of the data processor of a device shown in FIG. 4 in accordance with an embodiment of the present invention. The data processor 310 is similar to the data processor 210 shown in FIG. 3. The data processor 310 includes an input/output controller 312, a pass I/O set command decoder 314, an I/O switch control logic 316, a use-state register 318 and a data mode configuration register 320. The device processor 310 also includes various registers such as ID register 322 for storing the device ID, an operation register 324 for storing OP codes, address register 326 for storing the device address, input data register 328 for storing input data, clock generator 330 for generating clock signals for the various registers, and main logic execution circuitry 332 that controls the overall operation and logic of the device. All registers described above are flexible and capable of receiving multi-data width inputs.

The input/output controller 312 receives the ipei and opei signals corresponding to the SIPE and SOPE signals and issues a tm_en (test mode enable) signal during test mode operation. The SIPE and SOPE signals are provided to the input/output controller 312 either directly or indirectly from the controller 305. For example, the first device 301-1 receives, at its IPE and OPE pins, the SIPE and SOPE signals directly from the controller 305. Subsequent devices, 301-2 to 301-N, receive SIPE and SOPE signals propagated through the system of devices connected in series. Input data id0-id3, corresponding to input serial data SD0-SD3, is decoded during a test mode/pass I/O set command operation in response to the tm_en signal. For example, the first device 301-1 receives, at its input pins D0-D3, input serial data SD0-SD3 directly from the controller 305. Subsequent devices, 301-2 to 301-N, receive input serial data SD0-SD3 propagated through the system of devices connected in series. The I/O switch control logic 316 issues the switch logic control signals S1-S4 that determine the data width mode (X1/X2/X4 mode) as shown in FIG. 9B. The I/O switch control logic 316 also sets the use-state registers 318 to indicate status the pins that correspond to "passed" data channels and the data mode configuration register 320. The clock generator 330 receives an internal clock signal iclk that is derived from the clock signal CLK for generating clock signals for the various controllers, registers, etc of the data processor 310.

Table 2 shows the truth table of switch logic output control signals S1-S4 depending on the fail and pass combinations shown in Table 1. X1 and X2 mode controls are performed with different control signals as shown in FIG. 9B.

TABLE 2

S1~S4 binary output regarding failed I/O combinations

| D3/Q3 | D2/Q2 | D1/Q1 | D0/Q0 | Data width | S4 | S3 | S2 | S1 |
|---|---|---|---|---|---|---|---|---|
| X | X | X | ○ | X1 mode | 0 | 0 | 0 | 0 |
| X | X | ○ | X | | 0 | 0 | 0 | 1 |
| X | ○ | X | X | | 0 | 0 | 1 | 0 |
| ○ | X | X | X | | 0 | 0 | 1 | 1 |
| X | X | ○ | ○ | X2 mode | 0 | 0 | 0 | 0 |
| X | ○ | X | ○ | | 0 | 1 | 0 | 0 |
| ○ | X | X | ○ | | 1 | 0 | 0 | 0 |
| X | ○ | ○ | X | | 0 | 1 | 0 | 1 |
| ○ | X | ○ | X | | 1 | 0 | 0 | 1 |
| ○ | ○ | X | X | | 1 | 0 | 1 | 0 |
| X | ○ | ○₁ | ○₁ | | 0 | 0 | 0 | 0 |
| ○ | ○₁ | X | ○₁ | | 0 | 1 | 0 | 0 |
| ○ | X | ○₁ | ○₁ | | 0 | 0 | 0 | 0 |
| ○ | ○₁ | ○₁ | X | | 0 | 1 | 0 | 1 |

Figure 9A:
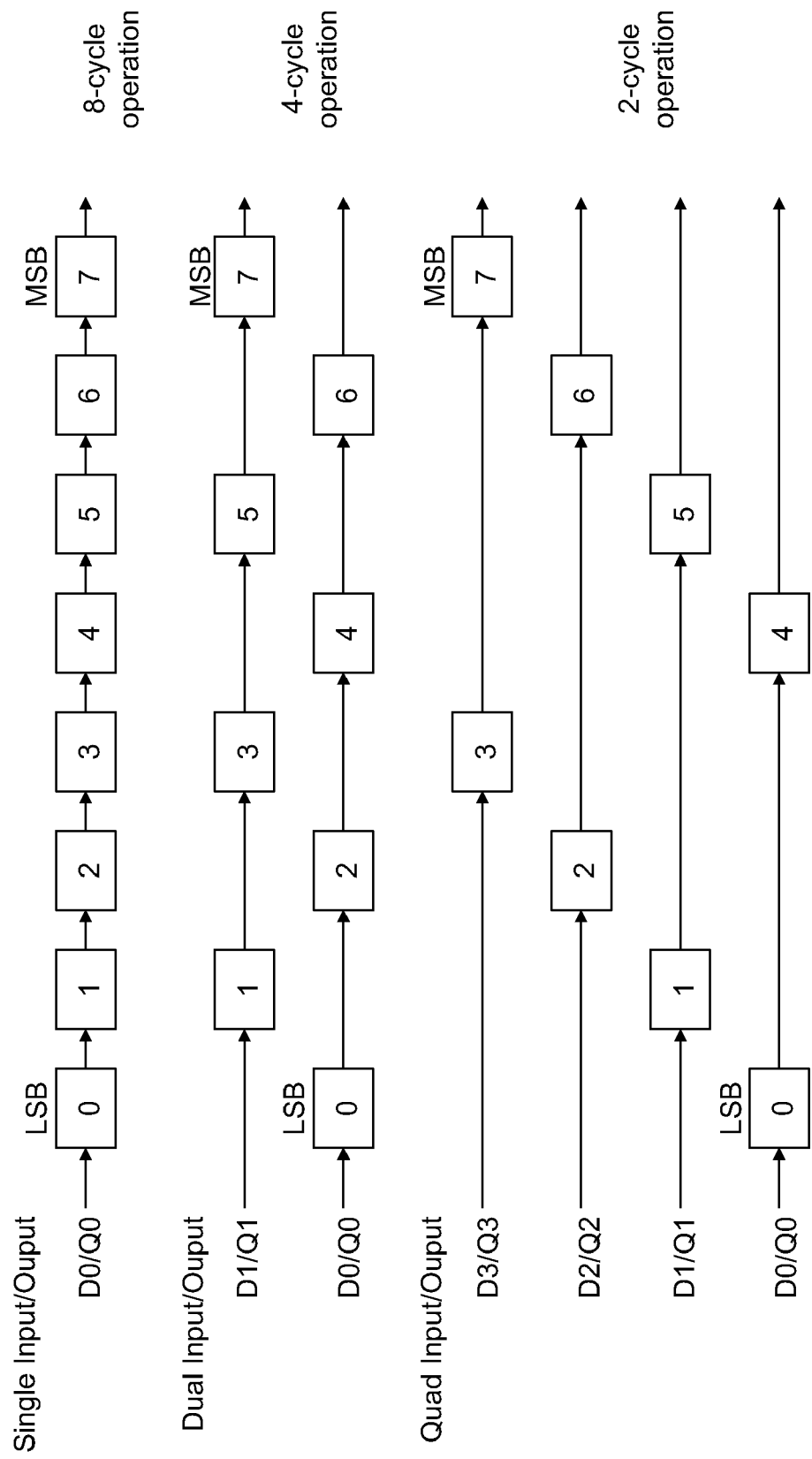
FIG. 9A is an illustration of operation of a device shown in FIG. 4 in multi-data width modes (X1/X2/X4 modes) using input pins (D0-D3) and corresponding output pins (Q0-Q3) in accordance with an embodiment of the present invention.
Figure 9B:
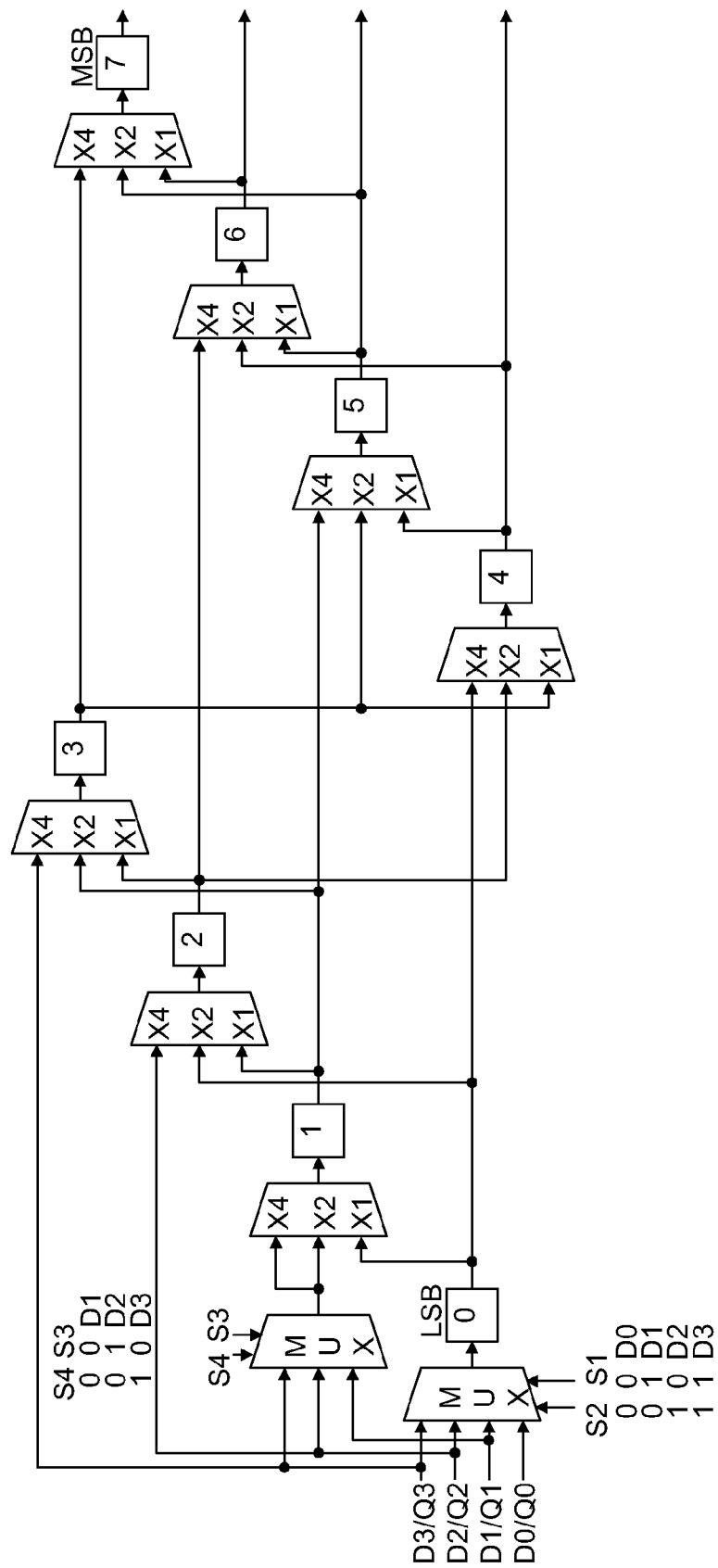
FIG. 9B is an illustration of configuration internal registers for multi-data width modes (X1/X2/X4 modes) in accordance with an embodiment of the present invention.

FIG. 9A is an illustration of operation of a device shown in FIG. 4 in multi-data width modes (X1/X2/X4 modes) using input pins (D0-D3) and corresponding output pins (Q0-Q3) in accordance with an embodiment of the present invention. As described earlier, a byte of data is transferred in eight clock cycles in the X1 mode using a single set of pins (default D0 and Q0); four clock cycles in the X2 mode using a two sets of pins (default D0, D1 and Q0, Q1), and two clock cycles in the X4 mode using all pins (D0-D3 and Q0-Q3). However, the default pin assignments can be changed after the test mode operation determines that certain pins are not usable. A reassignment of the pins assigned for X1 or X2 mode can be made based on the status of the use-state registers 318, data mode configuration register 320, and the switch logic control signals S1-S4.

An example of switch control logic circuit based on Table 2 is shown in FIG. 9B. X4/X2/X1 signals are generated from the data mode configuration register 320. Two modes (X2/X1) are available if any one of the data channels fails. According to the number of failed data channels, X1 mode or X2 mode is determined.

The embodiments disclosed herein are described with respect to a system of devices connected in series wherein each of the devices in the system has four input/output ports to support X1/X2/X4 modes depending on system requirements. Aspects of the present invention may be applicable to systems with more than two input/output ports without any restrictions, logically and technically.

In the above described embodiments of the present invention it is assumed that all devices in the system are connected in series as shown in FIG. 1 or 4. It is also assumed that IPE and OPE ports and internal relevant circuits along with the interconnection lines between the respective IPE/OPE pins of the devices not defective. A device with defective IPE and/or OPE pins cannot enable serial data propagation. Furthermore, it is assumed that the reset pin is not defective and can initialize the device IDs, use-state registers, and the data mode configuration during hard reset prior to test mode operation. The default mode on power-up can be set to X1 mode.

Typically, the possibility of malfunction due to hard-defects on relevant logic and interconnections of input/output pins is not high, but if malfunction occurs while devices are being used, all modules on a system board are generally replaced. Replacement cost of all the modules or the entire system board is much higher than the replacement of a single device and data recovery from the failed device or system board may be impossible. The embodiments disclosed herein can allow cost reduction and provides more stable operating condition to the system. Using the embodiments disclosed herein, cumulative yield of device production, without many additional circuit implementations into the device, could be increased (more devices can be used even though operation at maximum data width configuration may not be possible).

The embodiments described herein also enable the recovery of any data on a failed device in the system of devices connected in series. For example, data can be recovered from failed hard disks, such as in Solid State Disk (SSD) based on flash memory. Ideally, SSD reliability and durability are much better than the hard disk that consists of mechanical parts like rapidly rotating platters and a motor. But, accidental damage or wearing out of routes or pins cannot be avoided and can result in the non-data recovery in SSD system. The embodiment disclosed herein resolves those problems without removing parts or breaking up the board or system parts.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

Embodiments of the invention can be represented as a software product stored in a machine-readable medium (also referred to as a computer-readable medium, a processor-readable medium, or a computer usable medium having a computer-readable program code embodied therein). The machine-readable medium can be any suitable tangible medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention can also be stored on the machine-readable medium. Software running from the machine-readable medium can interface with circuitry to perform the described tasks.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A method for enabling data channels in series-connected devices, the method comprising:
applying a test pattern to a plurality of input ports at a first device of the series-connected devices, the plurality of input ports having a corresponding plurality of output ports at a last device of the series-connected devices, each data channel defining a data path between corresponding pairs of input and output ports;
detecting an enabled data channel if the test pattern is received at its corresponding output port;
setting maximum data width for transmission based on the number of detected enabled data channels; and
configuring a data mode configuration register in each of the series-connected devices to indicate the maximum data width for transmission.

2. The method of claim 1, further comprising:
upon detecting the enabled data channel, enabling corresponding use-state registers associated therewith in each of the series-connected devices.

3. The method of claim 2, further comprising:
initializing use-state registers in each of the series-connected devices prior to applying the test pattern.

4. The method of claim 3, wherein the use-state registers in each of the series-connected devices is initialized to indicate a disabled state.

5. The method of claim 1, further comprising:
initializing device identifiers (IDs) in each of the series-connected devices prior to applying the test pattern.

6. The method of claim 5, wherein the initializing device IDs comprises:
initializing the device IDs in each of the series-connected devices to a common value.

7. The method of claim 1, further comprising:
simultaneously asserting an input port enable and an output port enable signal prior to applying the test pattern.

8. A device for use in a system including a plurality of devices connected in series and a controller, the device comprising:
a plurality of input connections and corresponding plurality of output connections;
a plurality of use-state registers associated with each of the corresponding input and output connections to indicate a use-state of the corresponding input and output connections; and
a data mode configuration register to indicate the maximum data width for transmission through the device.

9. The device of claim 8, wherein a status of the plurality of use-state registers is set by the controller.

10. The device of claim 8, wherein a status of the data mode configuration registers is set by the controller.

11. The device of claim 8, wherein simultaneously asserting an input port enable signal and an output port enable signal causes the device to enter a test mode.

12. The device of claim 8, further comprising:
a device ID register for holding a device ID associated with the device.

13. A controller for enabling data channels in a plurality of devices connected in series, the controller comprising:
a test pattern provider for providing a test pattern to a plurality of input ports at a first device of the plurality of devices connected in series, the plurality of input ports having a corresponding plurality of output ports at a last device of the plurality of devices connected in series, each data channel defining a data path between corresponding pairs of input and output ports of the first and last devices in a data channel test operation, the controller detecting enabled data channels if the test pattern is received at its corresponding output port, the controller setting maximum data width for transmission based on the number of detected enabled data channels and configuring a data mode configuration register in each of the plurality of devices connected in series to indicate the maximum data width for transmission.

14. The controller of claim 13, further comprising:
a comparator for comparing the test pattern received at the plurality of the output ports to the test pattern provided to the plurality of input ports in the data channel test operation.

15. The controller of claim 13, further comprising:
a plurality of controller use-state registers associated with each of the corresponding input and output ports to indicate a use-state of the corresponding input and output ports.

16. The controller of claim 15, wherein the controller sets a status of the controller use-state registers and a status of a plurality of use-state registers in each of the devices.

17. The controller of claim 13, wherein the controller further comprises:
a controller data mode configuration register to indicate the maximum data width for transmission through the series-connected devices.

18. The controller of claim 17, wherein the controller sets a status of the controller data mode configuration register.

19. The controller of claim 13, wherein the controller simultaneously asserts an input port enable signal and an output port enable signal causing the devices to enter a test mode.

20. A system comprising:
a plurality of devices, having a plurality of data channels, connected in series;
the plurality of devices having a plurality of input ports at a first device of the plurality of devices connected in series, the plurality of input ports having a corresponding plurality of output ports at a last device of the plurality of devices connected in series, each data channel defining a data path between corresponding pairs of input and output ports; and
a controller coupled to the plurality of input ports and the corresponding plurality of output ports,
the controller having a test pattern provider for providing a test pattern to the plurality of input ports in a data channel test operation, the controller detecting enabled data channels if the test pattern is received at its corresponding output port, the controller setting maximum data width for transmission based on the number of detected enabled data channels and configuring a data mode configuration register in each of the plurality of devices connected in series to indicate the maximum data width for transmission.

21. The system of claim 20, wherein each of the plurality of devices connected in series further comprises:
a plurality of input connections and corresponding plurality of output connections, the plurality of the input connections of the first device of the plurality of devices connected in series defining the plurality of the input ports, and the plurality of the output connections of the last device of the plurality of devices connected in series defining the plurality of the output ports.

22. The system of claim 20, wherein each of the plurality of devices connected in series further comprises:
a plurality of use-state registers associated with each of the corresponding input and output connections to indicate a use-state of the corresponding input and output connections.

23. The system of claim 22, wherein the controller sets a status of the plurality of use-state registers of the plurality of devices connected in series.

24. The system of claim 20, wherein the controller further comprises:
a comparator for comparing the test pattern received at the plurality of the output ports to the test pattern provided to the plurality of input ports in the data channel test operation.

25. The system of claim 20, wherein the controller further comprises:
a plurality of controller use-state registers associated with each of the corresponding input and output ports to indicate a use-state of the corresponding input and output ports.

26. The system of claim 20, wherein the controller further comprises:
a controller data mode configuration register to indicate the maximum data width for transmission through the plurality of devices connected in series.

* * * * *